United States Patent [19]

Odani et al.

[11] Patent Number: 4,771,324
[45] Date of Patent: Sep. 13, 1988

[54] HETEROJUNCTION FIELD EFFECT DEVICE HAVING AN IMPLANTED REGION WITHIN A DEVICE CHANNEL

[75] Inventors: Kouichiro Odani, Sagamihara; Takashi Mimura, Machida, both of Japan

[73] Assignee: Fujitsu Limited, Kawasaki, Japan

[21] Appl. No.: 125,751

[22] Filed: Nov. 20, 1987

Related U.S. Application Data

[63] Continuation of Ser. No. 883,455, Jul. 8, 1986, abandoned, which is a continuation of Ser. No. 533,987, Sep. 20, 1983, abandoned.

[30] Foreign Application Priority Data

Sep. 24, 1982 [JP] Japan .................. 57-166141

[51] Int. Cl.⁴ .................. H01L 29/80
[52] U.S. Cl. .................. 357/22; 357/16; 357/58; 357/4
[58] Field of Search .................. 357/22 A, 22 MB, 16, 357/58, 4, 47, 83, 23.1, 23.8, 23.14, 23.15, 23.12, 22 C, 41

[56] References Cited

U.S. PATENT DOCUMENTS

| | | | |
|---|---|---|---|
| 3,900,351 | 8/1975 | Mukogawa et al. | 357/47 X |
| 4,173,767 | 11/1979 | Stevenson | 357/44 |
| 4,193,079 | 3/1980 | Yeh | 357/23.12 |
| 4,194,935 | 3/1980 | Dingle et al. | 357/22 X |
| 4,231,050 | 10/1980 | Casey, Jr. et al. | 357/16 |
| 4,396,437 | 8/1983 | Kwok et al. | 357/22 X |
| 4,424,525 | 1/1984 | Mimura | 357/22 X |
| 4,492,972 | 1/1985 | Gorecki | 357/22 |
| 4,603,469 | 8/1986 | Armiento et al. | 357/22 A X |

FOREIGN PATENT DOCUMENTS

| | | | |
|---|---|---|---|
| 0056904 | 8/1982 | European Pat. Off. | 357/22 MD |
| 0064370 | 11/1982 | European Pat. Off. | 357/22 MD |
| 52-23275 | 2/1977 | Japan | 357/22 MD |
| 59-84580 | 5/1984 | Japan | 357/22 MD |
| 60-103678 | 6/1985 | Japan | 357/22 MD |
| 5851574 | 12/1985 | Japan | 357/22 MD |

OTHER PUBLICATIONS

Mimura, "High Electron Mobility Transistor Logic", *Japanese Jour. of Appl. Physics*, vol. 20, No. 8, 1981, pp. L598–L600.

Long et al., "High Speed GaAs Integrated Circuits," *Proceedings of the IEEE*, vol. 70, No. 1, Jan. 1982, pp. 35–45.

Johnson, "Multiple Masking Technique in Ion Implantation," *IBM Technical Disclosure Bulletin*, vol. 15, No. 2, Jul. 1972, pp. 660–661.

*Primary Examiner*—Andrew J. James
*Assistant Examiner*—William A. Mintel
*Attorney, Agent, or Firm*—Staas & Halsey

[57] ABSTRACT

A depletion type element under the category of heterojunction field effect element having an n-region arranged in contact with a two-dimensional electron gas. More specifically a very limited region of the upper surface of the heterojunction faces the bottom surface of a gate electrode, thereby realizing various advantages, e.g.; (1) electron mobility is increased; (2) the resistivity is decreased in the source and drain regions as well as in the regions connecting the source and drain regions and the region facing the gate electrode; (3) the power consumption is decreased; (4) the reproductivity is improved, and (5) the overall reliability is improved.

5 Claims, 2 Drawing Sheets

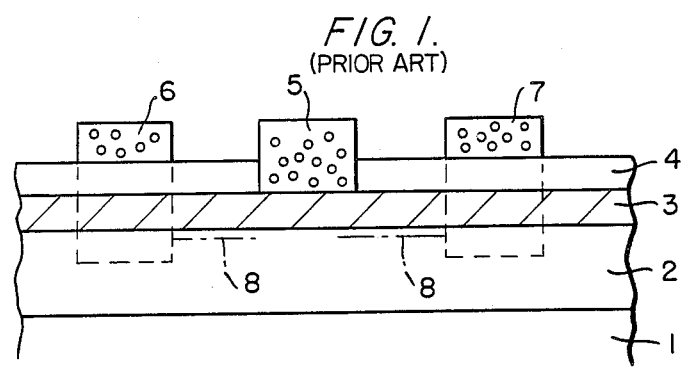
FIG. 1.
(PRIOR ART)
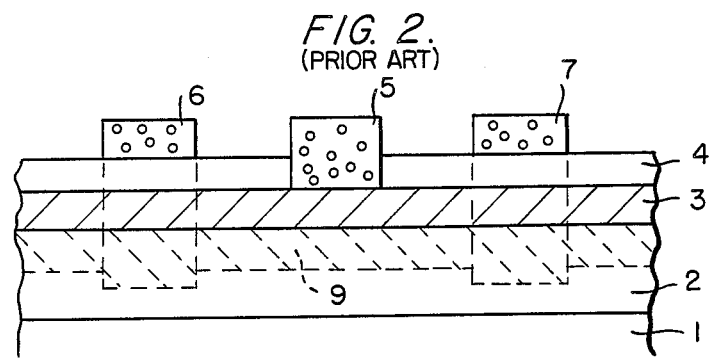
FIG. 2.
(PRIOR ART)
FIG. 3.
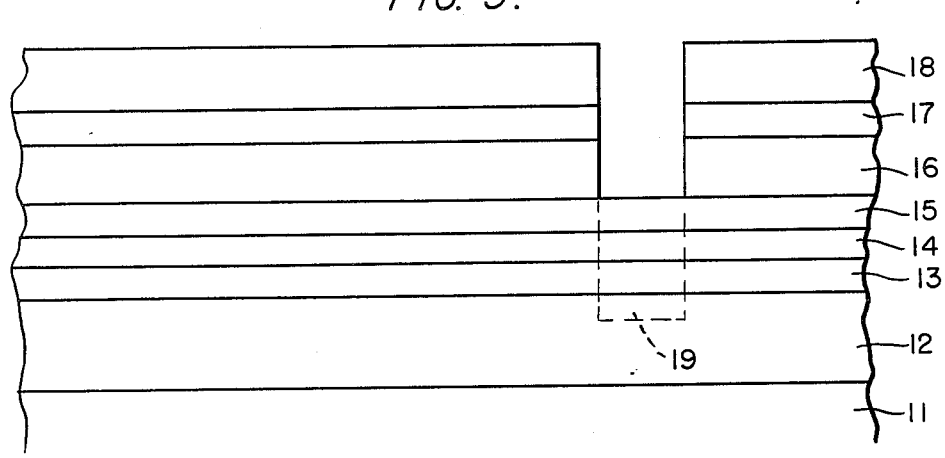
FIG. 4.
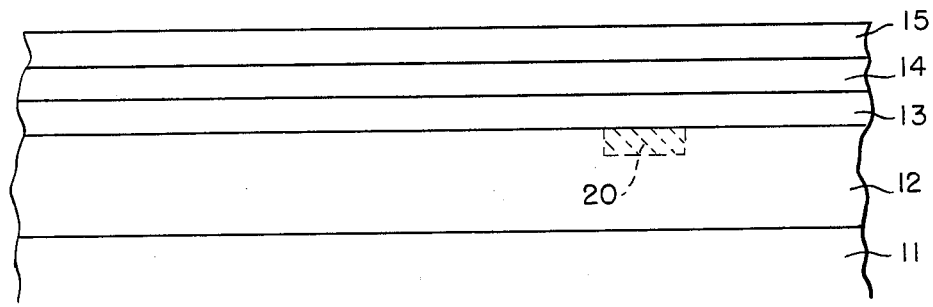

HETEROJUNCTION FIELD EFFECT DEVICE HAVING AN IMPLANTED REGION WITHIN A DEVICE CHANNEL

This is a continuation of co-pending application Ser. No. 883,455 filed on July 8, 1986, abandoned, which is a continuation of U.S. application Ser. No. 533,987, filed Sept. 20, 1983, now abandoned.

FIELD OF THE INVENTION

This invention relates to semiconductor devices, and more particularly to the structure of depletion type elements under the category of heterojunction field effect elements.

BACKGROUND OF THE INVENTION

To further improve the capability of information processing systems, a higher operation speed, a lower magnitude of power consumption and a higher unit capacity are required for semiconductor devices which are employed for such systems.

At present, silicon (Si) semiconductor devices are predominantly utilized for such purposes. However, since operation speed is rather limited for Si semiconductor devices due to the parameters based on the physical properties of Si, e.g., mobility of carriers moving therein, various efforts are being used to realize a higher operation speed and a lower magnitude of power consumption for semiconductor devices. One of the major aspects to which the aforementioned efforts are directed is utilization of compound semiconductors, e.g., gallium-arsenide (GaAs), in which the carrier mobility is by far greater than in Si.

Most transistors which utilize compound semiconductors are at present field effect transistors (hereinafter referred to as FET), particularly Schottky barrier gate FETs or junction gate FETs.

Since prior art semiconductor devices having a structure which allows carriers to pass through the space where impurities exist, the operation speed is rather limited due to various parameters including the effects of ionized-impurity scattering. This inspired the idea that separation of a space where carriers pass through from a space where impurities exist would be effective to increase the operation speed of a semiconductor device. Reducing this idea to practice resulted in the development of a new type of semiconductor device in which a conductive channel includes the electrons accumulated in a two-dimensional surface contiguous with a heterojunction interleaved between a pair of semiconductor layers, each having a different electron affinity. This new type of semiconductor device which utilizes the aforementioned accumulated electrons (hereinafter referred to as a two-dimensional electron gas) is named a heterojunction semiconductor device, because of the specific layer configuration. Since the thickness of a two-dimensional electron gas is extremely small, specifically, less than 100 angstroms, the two-dimensional electron gas has a geometrical position separated from either of the semiconductor layers forming the heterojunction. As a result, the two-dimensional electron gas becomes free of the effects of ionized-impurity scattering, and thus allows an extremely large amount of electron mobility, particularly at a cryogenic temperature within a temperature range not exceeding 150° K.

Referring to FIGS. 1 and 2, the layer configurations of two exemplary heterojunction field effect elements will be described below.

Referring to FIG. 1, an undoped GaAs layer 2, an n-AlGaAS layer 3 and an n-type AlGaAs layer 4 are respectively grown on a semi-insulating GaAs substrate 1. Heterojunctions are formed between GaAs layer 2 and AlGaAs layer 3 and between AlGaAs layer 3 and GaAs layer 4. A gate electrode 5 is produced on AlGaAs layer 3 or in a recess from which GaAs layer 4 is selectively removed to expose AlGaAs layer 3 at this location. Source and drain electrodes 6 and 7 are produced on GaAs layer 4.

Since the n-type AlGaAs layer 3 supplies electrons to a two-dimensional electron gas 8, the n-type AlGaAs layer 3 is named an electron source layer. Gate electrode 5 functions to regulate the surface electron density of the two-dimensional electron gas 8, resultantly regulating the impedance between source electrode 6 and drain electrode 7. Thus, the heterojunction field effect element having the layer configuration shown in FIG. 1, functions as an enhancement FET.

In the case of an enhancement FET shown above, undoped GaAs layer 2 is approximately 1 $\mu$m thick, n-type AlGaAs layer 3 is approximately 40 nm thick and n-type GaAs layer 4 is approximately 30 nm thick. These layers are grown in one step employing, e.g., molecular beam epitaxy (hereinafter referred to as MBE process). Impurities are introduced into the n-type AlGaAs layer 3 and n-type GaAs layer 4 during the MBE process.

A depletion type element can be produced, as shown in FIG. 2, by introducing n-type impurities or donors in the upper part of undoped GaAs layer 2 or the region where the two-dimensional electron gas 8 is otherwise accumulated, to produce an n-type region 9. In reality, however, this depletion type element does not necessarily function as a heterojunction field effect element. In other words, it rather resembles an insulated gate type FET. Since it does not necessarily show the features inherent to the aforementioned heterojunction field effect element, it can not be identified as a heterojunction field effect element.

Furthermore if an ion implantation process is employed for introduction of n-type impurities to the entire region (including a source region and a drain region) at which a depletion type element is produced (that is, an IC chip containing enhancement type elements and depletion type elements), as in the case of producing a GaAs Schottky barrier gate FET in the prior art, the problems listed below are inevitable, because a heat treatment is required for activation of the n-type impurities introduced by the ion implantation process.

(1) It is extremely difficult to activate an impurity, e.g., silicon (Si), implanted in the n-type AlGaAs layer 3.

(2) Damage is readily produced in the neighborhood of the heterojunction interleaved between the GaAs layer 2 and the n-type AlGaAs layer 3.

(3) Provided the temperature of the heat treatment is restricted to 700° C. to prevent the aforementioned heat damage from occurring, the Si implanted in the AlGaAs layer 3 is scarcely activated, and the activation rate of the Si implanted in GaAs layers 2 and 4 is decreased to approximately 60%.

(4) A heat treatment causes damge to occur not only in the neighborhood of the heterojunction but also in the entire region of the layer configuration, and this damage can not be recovered by annealing.

The above description has clarified that a depletion type element produced by employing an ion implantation process has drawbacks including (1) a decrease in electron mobility particularly in the layer in which a two-dimensional electron gas is expected to accumulate; (2) greater resistivity in the source region and the drain region, in the regions connecting the source region and the region facing a gate electrode, and in the regions connecting the drain region and the region facing the gate electrode; and (3) greater power consumption.

SUMMARY OF THE INVENTION

An object of the present invention is to provide a depletion type element under the category of heterojunction field effect elements wherein; (1) the electron mobility is increased; (2) the resistivity is decreased in the source region and the drain region, in the regions connecting the source region and the region facing a gate electrode, and in the regions connecting the drain region and the region facing a gate electrode, thereby decreasing the contact resistance of the source and drain; (3) the power consumption is decreased; (4) the reproductivity is improved; and (5) the overall reliability is improved.

A semiconductor device in accordance with the present invention includes a first semiconductor layer of an n-type semiconductor, and a second semiconductor layer of an undoped semiconductor having an electron affinity larger than that of the first semiconductor layer. The second semiconductor layer is formed so as to contact the first semiconductor layer and allow a two-dimensional electron gas to accumulate along the heterojunction between the first semiconductor layer and the second semiconductor layer. The second semiconductor layer has an n-type region formed in contact with the two-dimensional electron gas.

A typical example of the semiconductor of the first semiconductor layer is AlGaAs, and a typical example of the semiconductor of the second semiconductor layer is GaAs.

BRIEF DESCRIPTION OF THE DRAWINGS

The present invention, together with its various features and advantages, can be readily understood from the following more detailed description presented in conjunction with the drawings, wherein:

FIG. 1 is a cross-sectional view of a prior art enhancement type heterojunction field effect element;

FIG. 2 is a cross-sectional view of a prior art type element shown in FIG. 1;

FIG. 3 is a cross-sectional view of a wafer wherein a semiconductor device includes an enhancement type heterojunction field effect element and a depletion type heterojunction field effect element, in accordance with one embodiment of the present invention, including an ion implantation process for producing an n-type region which functions as the conductive channel of the depletion type heterojunction field effect element;

FIG. 4 is a cross-sectional view of the wafer shown in FIG. 3, after ion implanting, of the n-type region which is to function as the conductive channel of the type heterojunction field effect depletion element;

DESCRIPTION OF THE PREFERRED EMBODIMENTS

Figure 5:
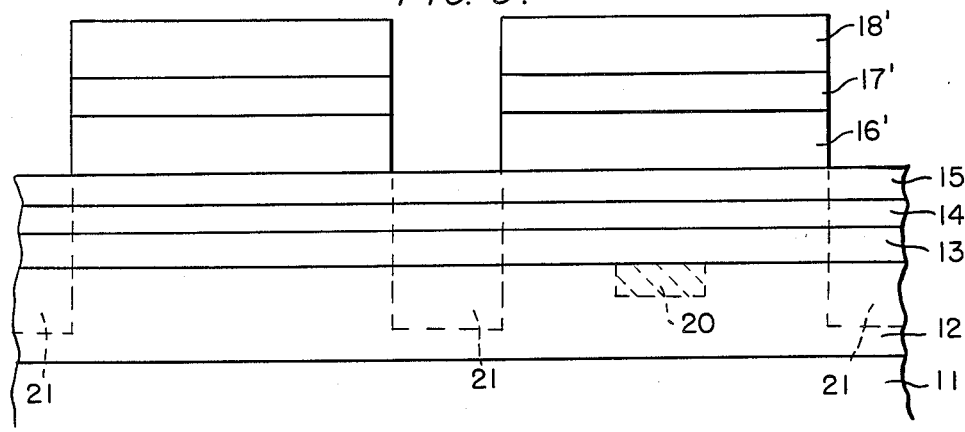
FIG. 5 is a cross-sectional view of the wafer shown in FIGS. 3 and 4, after completion of isolation regions.

In the following description, an embodiment in accordance with the present invention, wherein an enhancement type heterojunction field effect element and a depletion type heterojunction field effect element are produced on one semiconductor substrate, will be presented.

Referring to FIG. 3, an MBE process is employed to grow an undoped GaAs layer 12 having an approximate thickness of 1 μm, an n-type AlGaAs layer 13 doped to an approximate concentration of $1 \times 10^{18}/cm^3$ and having an approximate thickness of 40 nm, and an n-type GaAs layer 14 having an approximate thickness of 30 nm, in this order, on a semi-insulating GaAs substrate 11.

A protection film 15 of, e.g., aluminum nitride (AlN), is produced on the top surface of the n-GaAs layer 14 by employing, e.g., sputtering.

Photoresist, for example, resist AZ 1350J manufactured by Shipley Company is spin-coated on the top surface of the protection film 15 to produce a photoresist film 16, which is covered by a Ti film 17 which is further covered by an Au film 18. These piled layers 18, 17 and 16 are selectively removed from the location on which a gate electrode is scheduled to be produced. In reality, however, the area of the location from which the piled layers 18, 17 and 16 are removed in slightly larger than that of the gate electrode by a margin used for mask positioning. The remaining part of the piled layers 18, 17 and 16 functions as a mask for an ion implantation process with which an n-type impurity is introduced to a location where a highly n-type doped region, which functions as the conductive channel of the depletion type element is scheduled to be produced. The reason why the mask includes not only the photoresist film 16 but also of two metal films 17 and 18, is to enhance the protective ability of the interfaces of the n-type GaAs layer 14, n-type AlGaAs layer 13 and undoped GaAs layer 12, and particularly between the n-AlGaAs layer 13 and undoped GaAs layer 12 where a two-dimensional electron gas is accumulated.

Employing this mask, Si is implanted at a speed of, e.g., 170 KeV to $2 \times 10^{12}/cm^2$, to a region shown by 19 in FIG. 3.

Referring to FIG. 4, a so-called lift-off process is employed to remove the mask consisting of Au film 18, Ti film 17 and photoresist film 16.

A heat treatment process is then applied to the wafer at a temperature of, e.g., 700° C., for approximately 20 minutes, to activate the Si implanted in the previous step. In this manner, an n-type region 20 having an approximate impurity concentration of $1 \times 10^{17}/cm^3$ and which acts as the conductive channel of the depletion element, is produced in a very limited space in the undoped GaAs layer 12 along the heterojunction between the n-type AlGaAs layer 13 and the undoped GaAs layer 12. The n-region 20 precisely faces the location at which a gate electrode is scheduled to be produced on the n-type AlGaAs layer 13 in a later step. Due to the difficulty in activation of Si implanted in AlGaAs, the conductivity of the n-type AlGaAs layer 13 remains unchanged.

Referring to FIG. 5, photoresist resist AZ 1350J manufactured by the Shipley Co. is spin-coated on the top surface of the protection film 15 to produce a photoresist film 16' which is covered by a Ti film 17' which is further covered by an Au film 18'. Layers 18', 17', and 16' are selectively removed from the top surfaces of areas under which isolation regions 21 are scheduled to be produced. Employing the remaining part of the piled layers 18', 17' and 16' as a mask, oxygen (O) ions are implanted at a speed of 100 KeV, penetrate the n-type AlGaAs layer 13, to a depth of $2 \times 10^{12}/cm^2$ where the isolation regions 21 are scheduled to be produced and reach the undoped GaAs layer 12. After the ion implantation, an annealing process is applied to the wafer. Thus, isolation regions 21 which have a high resistance and which surround each element, are produced.

Figure 6:
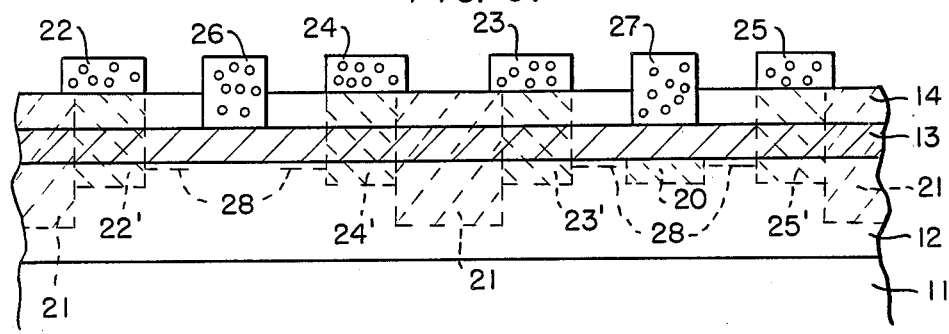
FIG. 6 is a cross-sectional view of a semiconductor device including an enhancement type heterojunction field effect element and a depletion type heterojunction field effect element in accordance with one embodiment of the present invention.

Referring to FIG. 6, the mask consisting of the piled layers 18', 17' and 16' and the protection film 15 are removed, before source electrodes 22 and 23 and drain electrodes 24 and 25, comprising Au.Ge/Au layers, are produced. A heat treatment process which is carried out at 450° C. for approximately 3 minutes causes Au.Ge to alloy with the compound semiconductors 14, 13 and 12, resultantly producing source regions 22' and 23' and drain regions 24' and 25'.

The n-type GaAs layer 14 is removed selectively from the locations at which gate electrodes are to be produced. This step can be carried out by employing a gas etching process using $CCl_2F_2$. At the locations from which the n-type GaAs layer 14 was selectively removed, gate electrodes 26 and 27 including, e.g., Ti/Pt/Au, are produced. The center of the bottom surface of the gate electrode 27 precisely corresponds to the center of the n-type region 20.

The above description has clarified that the aforementioned steps produce an integrated circuit including an enhancement type heterojunction field effect element and a depletion type heterojunction field effect element. The former (an enhancement type element) includes an undoped GaAs layer 12 formed on the semi-insulating GaAs substrate 11, an n-type AlGaAs layer 13 and an n-GaAs layer 14 which is partly removed from the location at which the gate electrode is scheduled to be formed, the source electrode 22 produced on the top surface of the n-type GaAs layer 14 and which is accompanied by the source region 22, the drain electrode 24 produced on the top surface of the n-type GaAs layer 14 and which is accompanied by the drain region 24', the gate electrode 26 produced on the top surface of the n-type AlGaAs layer 13, and isolation regions 21 which surround each element and comprise regions of high resistance. The thickness and impurity concentration of each layer are selected to allow the two-dimensional electron gas 28 to accumulate along the heterojunction between the n-type AlGaAs layer 13 and the undoped GaAs layer 12 and to function in an enhancement mode. The latter (a depletion type element) includes the undoped GaAs layer 12 formed on the semi-insulating GaAs substrate 11 and is provided with the n-region 20 formed in a limited region where the upper surface of the undoped GaAs layer 12 faces the bottom surface of the gate electrode 27, the n-type AlGaAs layer 13, and the n-type GaAs layer 14 which is partly removed from the location at which the gate electrode is scheduled to be formed. The depletion type element further includes the source electrode 23 formed on the top surface of the n-type GaAs layer 14 and which is accompanied by the source region 23', the drain electrode 25 formed on the top surface of the n-type GaAs layer 14 and which is accompanied by the drain region 25', the gate electrode 27 formed on the top surface of n-type AlGaAs layer 13, and isolation regions 21 which surround each element and comprise regions of high resistance.

The thickness and impurity concentration of each layer are in principle identical to those of the former (an enhancement type element), except for the n-type region 20 which is produced in a very limited region of which the upper surface of the n-region 20 faces the bottom surface of the gate electrode 17. Therefore, the surface electron density of the two-dimensional electron gas 28 which is allowed to accumulate along the heterojunction between the n-type AlGaAs layer 13 and the undoped GaAs layer 12 of this depletion type element is identical to that of the corresponding figure of the aforementioned enhancement type element, the location being contiguous with the n-type region 20. This is extremely important so as to reduce the contact resistance of the source and drain.

In addition, since no ions are implanted into source regions 22' and 23' and drain regions 24' and 25', no damage results in these regions. This is also important for reducing the contact resistance of the source and drain.

Figure 7:
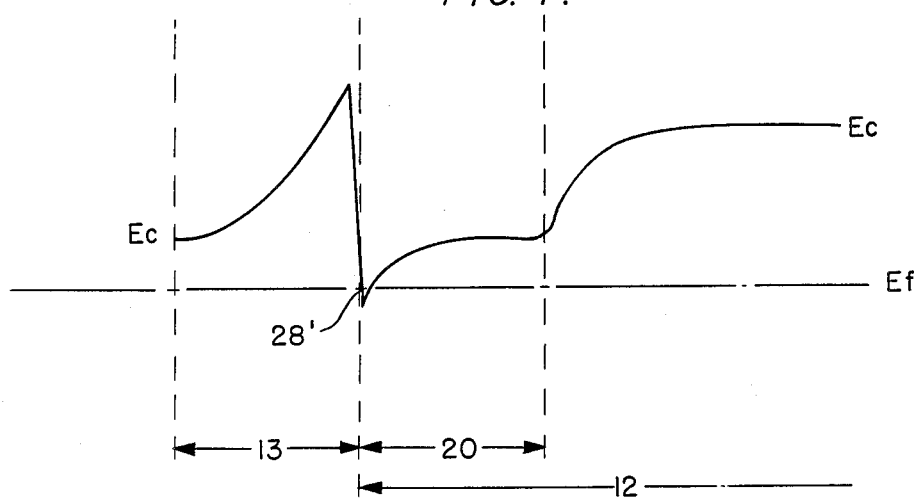
FIG. 7 is an energy band diagram of the depletion type heterojunction field effect element in accordance with one embodiment of the present invention.

Further, as shown in the energy band diagram (FIG. 7), a two-dimensional electron gas 28' is allowed to accumulate along the heterojunction between n-type AlGaAs layer 13 and the n-type region 20 which is located in the undoped GaAs layer 12, albeit the surface electron density is rather limited depending on the grade of damage produced in this location. In any case, however, the conductive channel of this depletion type element includes both the two-dimensional electron gas 28' and the electrons activated in the n-type region 20. As a result, the operating speed of this depletion type element is similar to that of the enhancement type element.

The foregoing description has clarified that a depletion type element under the category of heterojunction field effect element wherein: (1) the electron mobility is increased; (2) the resistivity is decreased in the source region and the drain region and also in the regions connecting the source region and the region facing the gate electrode and in the regions connecting the drain region and the region facing the gate electrode, resultantly decreasing the contact resistance of the source and drain; (3) the power consumption is decreased; (4) the reproductivity is improved; and (5) the overall reliability is improved, is successfully provided in accordance with the present invention.

The enhancement-depletion mode inverter is constructed by using the enhancement type element and the depletion type element as shown in FIG. 6 and the inverter is suitable for high speed operation.

Although the depletion type element has the gate electrode 27, a load element for an inverter circuit may not necessitate a gate electrode.

Figure 8:
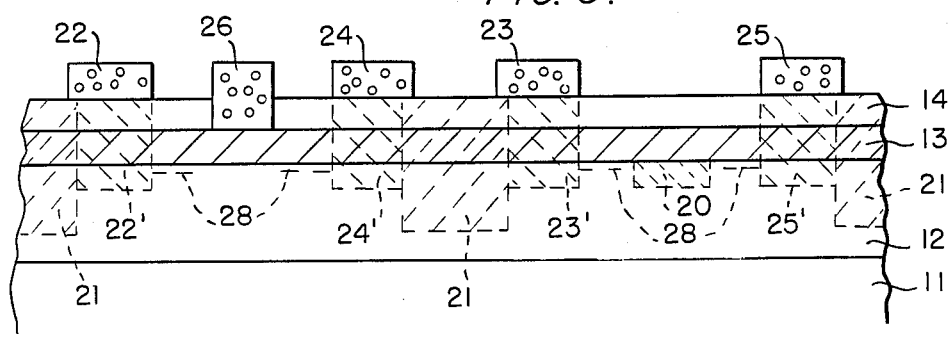
FIG. 8 is a cross-sectional view of a semiconductor device including an enhancement type heterojunction field effect element and a depletion load resistor element in accordance with one embodiment of the present invention.

FIG. 8 shows a cross section of the inverter circuit. The same reference numerals in FIG. 8 denote the same areas as explained in FIG. 6. It is noted that the recess etching is not carried out at the area where the load element is located. Since a gate electrode is not placed between the terminals of the load element, the inverter circuit as shown in FIG. 8 is suitable for higher integration.

While the present invention has been described with reference to a specific embodiment, this description is not meant to be construed in a limiting sense. Various modifications of the described embodiment, as well as other embodiments of this invention, will become apparent to persons skilled in the art upon reference to the description of the present invention. It is therefore contemplated that the appended claims will cover any such modifications or embodiments as fall within the true scope of this invention.

What is claimed is:

1. A semiconductor device comprising:
   a semiconductor substrate;
   a first semiconductor layer having an n-type conductivity, formed over said semiconductor substrate, and including first and second layers;
   a second semiconductor layer, formed between said semiconductor substrate and said first semiconductor layer, said second semiconductor layer being undoped and having an electron affinity greater than that of said first semiconductor layer, said second semiconductor layer being formed in contact with said first layer of said first semiconductor layer and a heterojunction being formed therebetween, to allow a two-dimensional electron gas to accumulate in said second semiconductor layer along said heterojunction, said two-dimensional electron gas providing a current path;
   an n-type region formed in a surface portion of said second semiconductor layer and directly contacting said first layer of said first semiconductor layer so as to contact said two-dimensional electron gas, said n-type region having first and second ends and formed in a portion of said current path, said first and second ends of said n-type region contacting said two-dimensional electron gas;
   a source region and a drain region formed in said first semiconductor layer and extending into said second semiconductor layer, said source and drain regions formed in said second semiconductor layer at predetermined lateral distances from said n-type region;
   a source electrode and a drain electrode formed on said second layer of said first semiconductor layer and ohmically contacting said two-dimensional electron gas; and
   a gate electrode formed on said second layer of said first semiconductor layer between said source and drain electrodes and directly above said n-type region.

2. A semiconductor device comprising:
   a semiconductor substrate;
   an enhancement mode element formed on said semiconductor substrate, said enhancement mode element including:
   a first semiconductor layer having an n-type conductivity and having a first ion-implanted portion;
   a second semiconductor layer, formed on said semiconductor substrate and being undoped, having an electron affinity greater than that of said first semiconductor layer, said first ion-implanted portion of said first semiconductor layer extending into said second semiconductor layer, said second semiconductor layer being formed in contact with said first semiconductor layer, forming a first portion of a heterojunction therebetween, to allow a two-dimensional electron gas to accumulate along said first portion of said heterojunction;
   a first gate electrode formed on said first semiconductor layer;
   a first source electrode and a first drain electrode formed on said first semiconductor layer, adjacent to said first gate electrode; and
   a first isolation region, formed surrounding said enhancement mode element, said first isolation region formed by the first ion-implanted portions of said first and second semiconductor layers to provide a high resistivity; and
   a depletion mode element formed within said semiconductor substrate, said depletion mode element including:
   said first semiconductor layer having the n-type conductivity and having a second ion-implanted portion;
   said second semiconductor layer being undoped, having an electron affinity greater than that of said first semiconductor layer, said second ion-implanted portion of said first semiconductor layer extending into said second semiconductor layer, said second semiconductor layer being formed in contact with said first semiconductor layer, forming a second portion of said heterojunction therebetween, to allow the two-dimensional electron gas to accumulate along said second portion of said heterojunction between said first semiconductor layer and said second semiconductor layer;
   an n-type region formed in said second semiconductor layer at a lateral distance from said second ion-implanted portion in said second semiconductor layer so as to contact said two-dimensional electron gas;
   a second gate electrode formed on said first semiconductor layer such that the bottom surface of said second gate electrode faces said n-type region;
   a second source electrode and a second drain electrode formed on said first semiconductor layer at a predetermined distance from said n-type region, and adjacent to said second gate electrode; and
   a second isolation region formed surrounding said depletion mode element, said second isolation region formed by said second ion-implanted portions of said first and second semiconductor layers to provide a high resistivity.

3. A load element of a semiconductor device comprising:
   a semiconductor substrate;
   a first semiconductor layer, formed over said semiconductor substrate and having an n-type conductivity, which acts as an electron source;
   a second semiconductor layer, formed between said semiconductor substrate and said first semiconductor layer, being undoped and having an electron affinity greater than that of said first semiconductor layer, said second semiconductor layer being formed in contact with said first semiconductor layer, forming a heterojunction therebetween, to allow a two-dimensional electron gas to accumulate in said second semiconductor layer along said heterojunction;

an n-type implanted region formed in a portion of said second semiconductor layer, directly contacting said first semiconductor layer and in contact with said two-dimensional electron gas;

source and drain regions formed in said first semiconductor layer and extending into said second semiconductor layer, said source and drain regions being a predetermined lateral distance from said n-type implanted region; and a pair of electrical terminals formed on said first semiconductor layer on said source and drain regions and ohmically contacting said two-dimensional electron gas, said pair of electrical terminals being placed so that a current path for the load element is defined by said n-type implanted region and said two-dimensional electron gas.

4. A semiconductor device comprising:

a substrate;

a first semiconductor layer having a first electron affinity and having ion-implanted portions;

a second semiconductor layer, having a second electron affinity greater than said first electron affinity and having ion-implanted portions formed under said ion-implanted portions of said first semiconductor layer, formed on said substate and in contact with said first semiconductor layer, forming a heterojunction therebetween for accumulating a two-dimensional gas;

an n-type region selectively formed in said second semiconductor layer and along said heterojunction;

a gate electrode formed on said first semiconductor layer above said n-type region;

isolation regions formed from said ion-implanted portions of said first semiconductor layer and extending into said ion-implanted portions of said semiconductor layer for providing a high resistivity;

source and drain regions formed in said first semiconductor layer and extending into said second semiconductor layer and formed adjacent to said isolation regions and at predetermined lateral distances from said n-type region; and source and drain electrodes respectively formed on said source and drain regions.

5. A semiconductor device having a substrate, comprising:

a first semiconductor layer having a first electron affinity and having ion-implanted portions;

a second semiconductor layer, having a second electron affinity greater than said first electron affinity and having ion-implanted portions, formed on the substrate and in contact with said first semiconductor layer, forming a heterojunction therebetween;

an n-type region selectively formed in said second semiconductor layer and along said heterojunction;

a gate electrode formed on said first semiconductor layer and above said n-type region;

isolation regions formed by said ion-implanted portions of said first semiconductor layer and extending into said ion-implanted portions of said second semiconductor layer;

source and drain regions formed adjacent to said isolation regions and at predetermined lateral distances from said n-type region; and source and drain electrode formed on said source and drain regions, respectively.

* * * * *

UNITED STATES PATENT AND TRADEMARK OFFICE
CERTIFICATE OF CORRECTION

PATENT NO. : 4,771,324

DATED : SEPTEMBER 13, 1988

INVENTOR(S) : KOUICHIRO ODANI ET AL.

It is certified that error appears in the above-identified patent and that said Letters Patent is hereby corrected as shown below:

FRONT PAGE [57] ABSTRACT, line 12, "," should be --;--.

Col. 1,  line 38, "FET)" should be --FETs)--;
         line 57, "device," should be --device--.

Col. 2,  line 5, "n-AlGaAS" should be --n-AlGaAs--.

Col. 3,  line 53, after "art" insert --depletion--;
         line 65, after "the" (second occurrence) insert --depletion--.

Col. 4,  line 49, after "element" insert --,--.

Col. 5,  line 10, before "resist" should be --(resist--;
         line 11, "Co." should be --Co.)--.

Col. 6,  line 21, "17" should be --27--;
         line 38, after "between" insert --the--.

UNITED STATES PATENT AND TRADEMARK OFFICE
CERTIFICATE OF CORRECTION

PATENT NO. : 4,771,324

DATED : SEPTEMBER 13, 1988

INVENTOR(S) : KOUICHIRO ODANI ET AL.

It is certified that error appears in the above-identified patent and that said Letters Patent is hereby corrected as shown below:

Column 10, line 35, "electrode" should be -- electrodes --.

Signed and Sealed this

Fourteenth Day of March, 1989

Attest:

DONALD J. QUIGG

Attesting Officer

Commissioner of Patents and Trademarks